US008552821B2

(12) United States Patent
Nagai

(10) Patent No.: US 8,552,821 B2
(45) Date of Patent: Oct. 8, 2013

(54) ELECTROMAGNETIC RESONANCE COUPLER

(71) Applicant: Panasonic Corporation, Osaka (JP)

(72) Inventor: Shuichi Nagai, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/760,412

(22) Filed: Feb. 6, 2013

(65) Prior Publication Data

US 2013/0147580 A1 Jun. 13, 2013

Related U.S. Application Data

(63) Continuation of application No. PCT/JP2012/003055, filed on May 10, 2012.

(30) Foreign Application Priority Data

May 11, 2011 (JP) ................................ 2011-105963

(51) Int. Cl.
H01P 7/00 (2006.01)
H01L 41/00 (2013.01)
(52) U.S. Cl.
USPC .......................................... 333/219; 310/320
(58) Field of Classification Search
USPC ........... 333/202, 204, 24 C, 24 R, 219, 219.1; 310/320
See application file for complete search history.

(56) References Cited

U.S. PATENT DOCUMENTS 4,939,403 A * 7/1990 Kittaka et al. ................ 310/320
5,045,744 A * 9/1991 Ando et al. ................... 310/320
5,484,764 A * 1/1996 Fiediuszko et al. ........... 505/210
6,621,194 B1 * 9/2003 Sugimoto et al. ............. 310/368
7,692,444 B2   4/2010 Chen et al.
2006/0250155 A1   11/2006 Chen et al.

FOREIGN PATENT DOCUMENTS

JP  2000-92752   3/2000
JP  2008-67012   3/2008
JP  2009-171017  7/2009
JP  2010-74937   4/2010

OTHER PUBLICATIONS

International Search Report issued Jun. 12, 2012 in International Application No. PCT/JP2012/003055.

(Continued)

Primary Examiner — Dean O Takaoka
(74) Attorney, Agent, or Firm — Wenderoth, Lind & Ponack, L.L.P.

(57) ABSTRACT

An electromagnetic resonance coupler includes a transmission resonator provided on the transmission substrate and having a shape obtained by opening a loop shape including an inwardly recessed portion in part to make a transmission resonator slit, transmission wiring connected to the transmission resonator, a reception substrate, a reception resonator provided on the reception substrate and having the same size and shape as the transmission resonator, and reception wiring connected to the reception resonator. The transmission and reception resonators are symmetric with respect to a point and face each other so that their contours match. In the transmission resonator, at least part of wiring constituting the recessed portion is close to wiring other than the at least part of wiring at a distance less than or equal to four times the wiring width of the transmission resonator.

19 Claims, 8 Drawing Sheets

(56) References Cited

OTHER PUBLICATIONS

Shuichi Nagai et al., "A DC-Isolated Gate Drive IC With Drive-by-Microwave Technology for Power Switching Devices", 2012 IEEE International Solid-State Circuits Conference (ISSCC 2012), Session 23, Advances in Heterogeneous Integration 23.3, Feb. 22, 2012, pp. 404-406.

André Kurs et al., "Wireless Power Transfer via Strongly Coupled Magnetic Resonances", Science, Jul. 6, 2007, vol. 317, No. 5834, pp. 83-86.

* cited by examiner (a)  (b)  (c)

ELECTROMAGNETIC RESONANCE COUPLER

CROSS REFERENCE TO RELATED APPLICATIONS

This is a continuation application of PCT International Application No. PCT/JP2012/003055 filed on May 10, 2012, designating the United States of America, which is based on and claims priority of Japanese Patent Application No. 2011-105963 filed on May 11, 2011. The entire disclosures of the above-identified applications, including the specifications, drawings and claims are incorporated herein by reference in their entirety.

FIELD

One or more exemplary embodiments disclosed herein relate generally to electromagnetic resonance couplers for use in non-contact power transmission apparatuses, non-contact signal transmission apparatuses, and signal isolators.

BACKGROUND

A non-contact transmission apparatus is known in which power or signals are transmitted among electrical apparatuses without requiring direct connection of the electrical apparatuses through wiring. For example, Patent Literature 1 discloses an electronic circuit element called a "digital isolator."

This technology enables isolation to be established between the ground of a logic signal and the ground of an RF signal. For example, non-contact transmission technology such as described above is used in a gate driving element such as a semiconductor switching element for power electronics, because the source potential of the semiconductor switching element varies based on a high voltage and thus it is necessary to insulate a direct-current component between the interior of the gate driving element and the power semiconductor switching element.

In transmission and reception of signals between a high-frequency semiconductor chip and an external device, if the transmission line is configured using wire bonding, uncertain parasitic capacitance or inductance that influences the characteristics of high-frequency signals will occur. The non-contact transmission technology as described above is also used in such a case.

As the non-contact transmission technology, electromagnetic resonance couplers (also called "electromagnetic field resonance couplers") that use the coupling of two electric wiring resonators as disclosed in Patent Literature 2 and Non-Patent Literature 1 have been gathering great attention in recent years. A feature of the electromagnetic resonance couplers is that highly efficient and long-range signal transmission is possible.

CITATION LIST

Patent Literature

[Patent Literature 1] Description of U.S. Pat. No. 7,692,444
[Patent Literature 2] Japanese Unexamined Patent Application Publication No. 2008-067012

Non Patent Literature

[Non-Patent Literature 1] Andre Kurs, et al., "Wireless Power Transfer via Strongly Coupled Magnetic Resonances," Science Express, Vol. 317, No. 5834, pp. 83-86 (2007)

SUMMARY

Technical Problem

It is an issue for the above-described electromagnetic resonance couplers to reduce the apparatus size without increasing the frequency of a high-frequency signal to be transmitted (operating frequency).

One non-limiting and exemplary embodiment provides an electromagnetic resonance coupler that can be reduced in size without increasing the operating frequency.

Solution to Problem

In one general aspect, the techniques disclosed here feature an electromagnetic resonance coupler for transmitting a signal between first resonant wiring and second resonant wiring without contact. The electromagnetic resonance coupler includes a first substrate, and a second substrate facing the first substrate, wherein the first resonant wiring and first input/output wiring are provided on the first substrate, the first resonant wiring having a loop shape that includes an inwardly recessed portion and an opening, and the first input/output wiring being connected to a first connection portion in the first resonant wiring, the second resonant wiring and second input/output wiring are provided on the second substrate, the second resonant wiring having the same wiring width and the same shape as the first resonant wiring, and the second input/output wiring being connected to a second connection portion in the second resonant wiring, when viewed in a direction perpendicular to a main face of the first substrate, the first resonant wiring and the second resonant wiring are symmetric with respect to a point, and contours of the first resonant wiring and the second resonant wiring match, a distance between the first resonant wiring and the second resonant wiring in a direction perpendicular to the main face of the first substrate is less than or equal to one half a wavelength of the signal, and in the first resonant wiring, at least part of wiring that constitutes the recessed portion is close to wiring other than the at least part of wiring that constitutes the recessed portion at a distance that is less than or equal to four times the wiring width of the first resonant wiring.

These general and specific aspects may be implemented using a system, a method, an integrated circuit, a computer program, or a computer-readable recording medium such as a CD-ROM, or any combination of systems, methods, integrated circuits, computer programs, or computer-readable recording media.

Additional benefits and advantages of the disclosed embodiments will be apparent from the Specification and Drawings. The benefits and/or advantages may be individually obtained by the various embodiments and features of the Specification and Drawings, which need not all be provided in order to obtain one or more of such benefits and/or advantages.

Advantageous Effects

With the electromagnetic resonance couplers according to one or more exemplary embodiments, it is possible to easily reduce size without increasing operating frequency.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS (Underlying Knowledge Forming Basis of the Present Disclosure)

In relation to the electromagnetic resonance coupler disclosed in the Background section, the inventors have found the following problem.

As described in the Background section, electromagnetic resonance couplers that enable highly efficient and long-range signal transmission are known as an example of the non-contact transmission technology.

Figure 1:
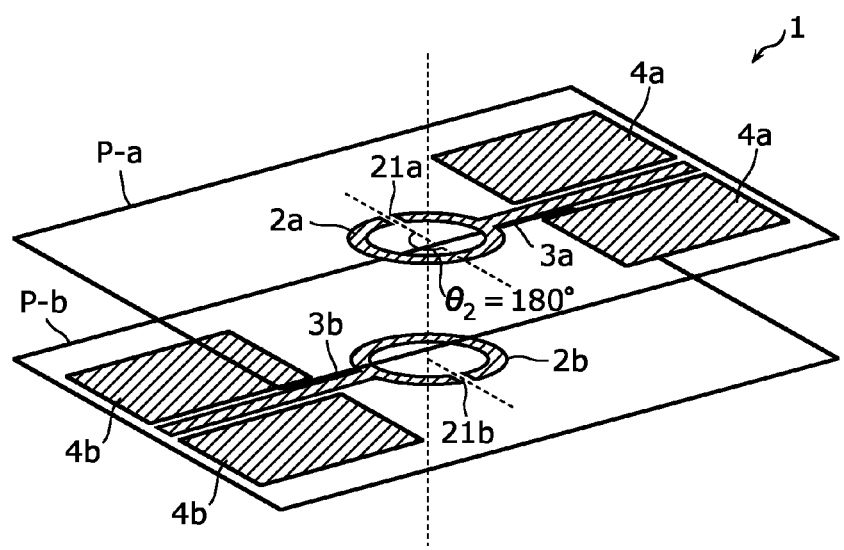
FIG. 1 is a schematic diagram of a conventional open-ring electromagnetic resonance coupler.

Among these electromagnetic resonance couplers, an open-ring electromagnetic resonance coupler as illustrated in FIG. 1 exhibits an excellent transmission characteristic although its structure is simple.

Figure 2:
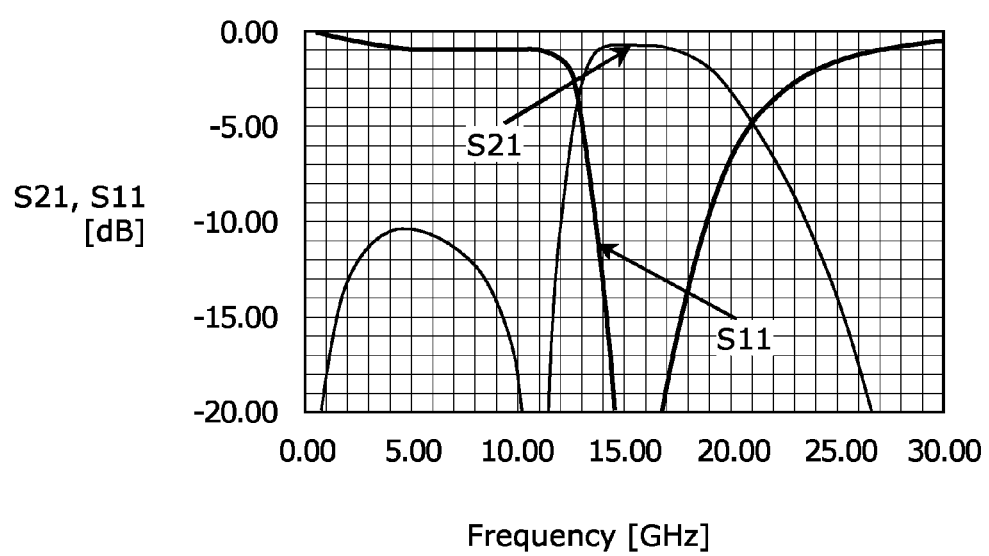
FIG. 2 shows a transmission characteristic of the conventional open-ring electromagnetic resonance coupler.

FIG. 2 shows a transmission characteristic of a conventional open-ring electromagnetic resonance coupler having the structure in FIG. 1.

In FIG. 2, S21 denotes an insertion loss with the open-ring electromagnetic resonance coupler and indicates that electric signals at or near the frequency of 15 GHz can be efficiently transmitted with an insertion loss of approximately 1 dB.

The frequency of signals that the open-ring electromagnetic resonance coupler can transmit (operating frequency) is, to be precise, determined by the inductance and capacitance of ring-shaped resonant wiring in the electromagnetic resonance coupler. However, the operating frequency can be approximately obtained as follows (Formula 1) from the effective area of the ring-shaped wiring and the dielectric constant of a substrate on which the ring-shaped wiring is formed.

$$fr = \frac{1}{2\pi\sqrt{LC}} \approx \frac{c}{2\pi a\sqrt{\varepsilon_r}} \quad \text{[Formula 1]}$$

In Formula 1, c denotes the light velocity and $\varepsilon_r$ denotes the relative dielectric constant of the substrate (dielectric). Also, a denotes the effective area of the ring-shaped wiring, which is approximately the diameter of the ring.

For example, the operating frequency band of an open-ring electromagnetic resonance coupler that has a thickness of 200 μm and is formed on a sapphire substrate having a diameter of 1 mm as illustrated in FIG. 1 is at or near 15 GHz. It is found from Formula 1 that if the diameter of the open-ring electromagnetic resonance coupler is doubled, the operating frequency is reduced to one half, that is, the 7.5-GHz frequency band.

When a power transmission apparatus is configured using an open-ring electromagnetic resonance coupler, the open-ring electromagnetic resonance coupler is integrated together with, for example, a transmission circuit element and a reception circuit element for use in power and signal transmission.

Here, the transmission circuit element and the reception circuit element are very small, on the order of several micrometers, whereas the open-ring electromagnetic resonance coupler is large, on the order of several millimeters, as mentioned above.

As can be seen from Formula 1 above, it is possible to reduce the size of the open-ring electromagnetic resonance coupler by increasing the operating frequency. However, as the operating frequency increases, the open-ring electromagnetic resonance coupler tends to be more influenced by its uncertain parasitic capacitance and inductance, and expensive transmission and reception circuit elements that are compatible with high frequencies are necessary for proper operation.

Thus, the challenge is to realize an electromagnetic resonance coupler that can be reduced in size without increasing the operating frequency.

According to an exemplary embodiment disclosed herein, the electromagnetic resonance coupler is an electromagnetic resonance coupler for transmitting a signal between first resonant wiring and second resonant wiring without contact. The electromagnetic resonance coupler includes a first substrate, and a second substrate facing the first substrate, wherein the first resonant wiring and first input/output wiring are provided on the first substrate, the first resonant wiring having a loop shape that includes an inwardly recessed portion and an opening, and the first input/output wiring being connected to a first connection portion in the first resonant wiring, the second resonant wiring and second input/output wiring are provided on the second substrate, the second resonant wiring having the same wiring width and the same shape as the first resonant wiring, and the second input/output wiring being connected to a second connection portion in the second resonant wiring, when viewed in a direction perpendicular to a main face of the first substrate, the first resonant wiring and the second resonant wiring are symmetric with respect to a point, and contours of the first resonant wiring and the second resonant wiring match, a distance between the first resonant wiring and the second resonant wiring in a direction perpendicular to the main face of the first substrate is less than or equal to one half a wavelength of the signal, and in the first resonant wiring, at least part of wiring that constitutes the recessed portion is close to wiring other than the at least part of wiring that constitutes the recessed portion at a distance that is less than or equal to four times the wiring width of the first resonant wiring.

With this, it is possible to increase the inductance components of the resonant wirings by providing the resonant wirings close to each other. Accordingly, the operating frequency can be reduced in accordance with Formula 1. That is, it is possible to reduce the size of the electromagnetic resonance coupler.

For example, the opening may be provided in at least part of wiring that constitutes the recessed portion.

With this, it is possible to increase the capacitance components of the resonant wirings by bringing the opening of each resonant wiring close to the other resonant wiring. Accordingly, the operating frequency can be reduced in accordance with Formula 1. That is, it is possible to reduce the size of the electromagnetic resonance coupler.

For example, the first resonant wiring may have a shape that includes five or more bent portions.

With this, it is possible to reduce the areas occupied by the resonant wirings on the substrates. That is, the size of the electromagnetic resonance coupler can be reduced. There is also an effect of increased inductance components of the resonant wirings due to the densely packed wirings. Accordingly, it is possible to reduce the size of the electromagnetic resonance coupler.

For example, a contour of the first resonant wiring, excluding wiring that constitutes the recessed portion, may be rectangular.

With this, it is possible to reduced the areas occupied by the resonant wirings on the substrates. That is, the size of the electromagnetic resonance coupler can be reduced.

For example, the first resonant wiring may have a symmetrical shape.

Thus forming the resonant wirings in a symmetrical shape enables signal transmission in a wide frequency band.

For example, ground wiring that represents a reference potential of the signal may be provided on a face of the first substrate on which the first resonant wiring is not provided or a face of the second substrate on which the second resonant wiring is not provided.

The electromagnetic resonance coupler may further include a cap substrate facing the second substrate, wherein ground wiring that represents a reference potential of the signal may be provided on a face of the cap substrate opposite the second substrate.

For example, ground wiring that represents a reference potential of the signal may be provided in a periphery of the first resonant wiring and the first input/output wiring on the first substrate or in a periphery of the second resonant wiring and the second input/output wiring on the second substrate.

The electromagnetic resonance coupler may further include a cap substrate facing the second substrate, wherein first ground wiring that represents a reference potential of the signal may be provided on a face of the cap substrate opposite the second substrate, second ground wiring that represents the reference potential of the signal may be provided in a periphery of the second resonant wiring and the second input/output wiring on the second substrate, and the first ground wiring and the second ground wiring may be connected to each other through a via hole.

Thus appropriately providing the ground wirings in the electromagnetic resonance coupler enhances confinement of the electromagnetic field of a high-frequency signal to be transmitted. It is thus possible to transmit the signal with high efficiency and to suppress unwanted radiation to the outside.

For example, the first connection portion may be provided at a position that is away from one end of the first resonant wiring by a distance corresponding to one fourth a wiring length of the first resonant wiring, and the second connection portion may be provided at a position that is away from one end of the second resonant wiring by a distance corresponding to one fourth a wiring length of the second resonant wiring.

According to an exemplary embodiment disclosed herein, the electromagnetic resonance coupler is an electromagnetic resonance coupler for transmitting a signal between first resonant wiring and second resonant wiring without contact. The electromagnetic resonance coupler includes a first substrate, and a second substrate facing the first substrate, wherein the first resonant wiring and first input/output wiring are provided on the first substrate, the first resonant wiring having a loop shape of a predetermined wiring width, and the first input/output wiring being connected to a first connection portion in the first resonant wiring, the second resonant wiring and second input/output wiring are provided on the second substrate, the second resonant wiring having the same wiring width and the same shape as the first resonant wiring, and the second input/output wiring being connected to a second connection portion in the second resonant wiring, when viewed in a direction perpendicular to a main face of the first substrate, the first resonant wiring and the second resonant wiring are symmetric with respect to a point, and contours of the first resonant wiring and the second resonant wiring match, a distance between the first resonant wiring and the second resonant wiring in the direction perpendicular to the main face of the first substrate is less than or equal to one half a wavelength of the signal, and a wiring length from an outer end of the first resonant wiring to the first connection portion is longer than a wiring length from an inner end of the first resonant wiring to the first connection portion and is less than or equal to one half a wiring length of wiring that is routed along an outermost periphery of the first resonant wiring.

For example, the first resonant wiring may have a shape that includes two or more bent portions in wiring that extends from the inner end of the first resonant wiring to the first connection portion, and two or more bent portions in wiring that extends from the outer end of the first resonant wiring to the first connection portion.

With this, it is possible to reduce the areas occupied by the resonant wirings on the substrates. That is, the size of the electromagnetic resonance coupler can be reduced.

For example, wiring that extends from the inner end of the first resonant wiring to the first connection portion may include a portion that is close to wiring that extends from the outer end of the first resonant wiring to the first connection portion at a distance that is less than or equal to four times the predetermined wiring width.

With this, it is possible to increase the inductance components of the resonant wirings by bringing the resonant wirings close to each other. Accordingly, the operating frequency can be reduced in accordance with Formula 1. That is, it is possible to reduce the size of the electromagnetic resonance coupler.

For example, a contour of the first resonant wiring may be rectangular.

With this, it is possible to reduce the areas occupied by the resonant wirings on the substrates. That is, the size of the electromagnetic resonance coupler can be reduced.

For example, the first resonant wiring may have a symmetrical shape.

Thus forming the resonant wirings in a symmetrical shape enables signal transmission in a wide frequency band.

For example, ground wiring that represents a reference potential of the signal may be provided on a face of the first substrate on which the first resonant wiring is not provided or a face of the second substrate on which the second resonant wiring is not provided.

The electromagnetic resonance coupler may further include a cap substrate superimposed above the second substrate, wherein ground wiring that represents a reference potential of the signal may be provided on a face of the cap substrate opposite the second substrate.

For example, ground wiring that represents a reference potential of the signal may be provided in a periphery of the first resonant wiring and the first input/output wiring on the first substrate or in a periphery of the second resonant wiring and the second input/output wiring on the second substrate.

The electromagnetic resonance coupler may further include a cap substrate superimposed above the second substrate, wherein first ground wiring that represents a reference potential of the signal may be provided on a face of the cap substrate opposite the second substrate, second ground wiring that represents the reference potential of the signal may be provided in a periphery of the second resonant wiring and the second input/output wiring on the second substrate, and the first ground wiring and the second ground wiring may be connected to each other through a via hole.

Thus appropriately providing the ground wirings in the electromagnetic resonance coupler enhances confinement of the electromagnetic field of a high-frequency signal to be transmitted. It is thus possible to transmit the signal with high efficiency and to suppress unwanted radiation to the outside.

These general and specific aspects may be implemented using a system, a method, an integrated circuit, a computer program, or a computer-readable recording medium such as a CD-ROM, or any combination of systems, methods, integrated circuits, computer programs, or computer-readable recording media.

Hereinafter, certain exemplary embodiments are described in greater detail with reference to the accompanying drawings.

Each of the exemplary embodiments described below shows a general or specific example. The numerical values, shapes, materials, structural elements, the arrangement and connection of the structural elements, steps, the processing order of the steps etc. shown in the following exemplary embodiments are mere examples, and therefore do not limit the scope of the appended claims and their equivalents. Therefore, among the structural elements in the following exemplary embodiments, structural elements not recited in any one of the independent claims are described as arbitrary structural elements.

Embodiment 1

(Structure)

First, the structure of an electromagnetic resonance coupler according to Embodiment 1 will be described.

Figure 3:
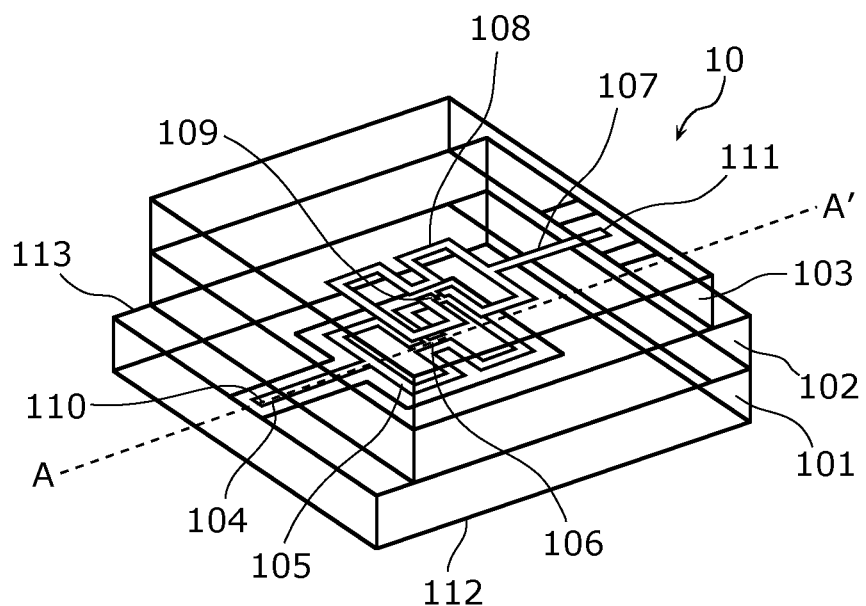
FIG. 3 is an oblique (perspective) view of an electromagnetic resonance coupler according to Embodiment 1.

FIG. 3 is an oblique (perspective) view of the electromagnetic resonance coupler according to Embodiment 1.

Figure 4:
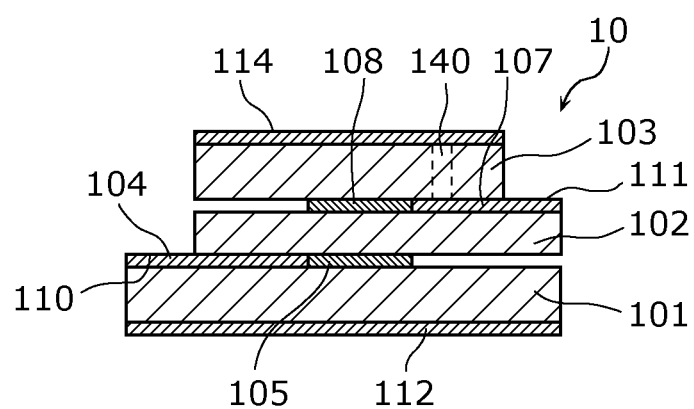
FIG. 4 is a cross-sectional view of the electromagnetic resonance coupler according to Embodiment 1.

FIG. 4 is a cross-sectional view of the electromagnetic resonance coupler in FIG. 3, taken along a broken line connecting A and A' and along a plane perpendicular to substrates.

An electromagnetic resonance coupler 10 includes a transmission substrate 101 (first substrate), a reception substrate 102 (second substrate) provided above the transmission substrate 101, and a cap substrate 103 provided above the reception substrate 102. The transmission substrate 101, the reception substrate 102, and the cap substrate 103 are dielectrics. In Embodiment 1, the material for the dielectrics is sapphire. Note that the dielectrics may be made of another material including a silicon semiconductor.

As illustrated in FIG. 4, a back face ground 112 is disposed on the underside of the transmission substrate 101. The back face ground 112 is a metal conductor. The material for the back face ground 112 is, for example, gold. The back face ground 112 is wiring that represents a reference potential of a high-frequency signal to be transmitted in the transmission substrate 101.

As illustrated in FIG. 4, transmission wiring 104 (first input/output wiring) and a transmission resonator 105 (first resonant wiring) are disposed on a top face of the transmission substrate 101. One end of the transmission wiring 104 is electrically connected to the transmission resonator 105 on a first connection portion of the transmission resonator 105. The first connection portion is provided at a position that is away from one end of the transmission resonator 105 by a distance corresponding to one fourth the wiring length of the transmission resonator 105. The transmission wiring 104 and the transmission resonator 105 are configured by metal wiring. The material for the metal wiring is, for example, gold.

The transmission resonator 105 has a transmission resonator slit 106 (opening). The details of the shape of the transmission resonator 105 will be described later.

As illustrated in FIG. 3, a coplanar ground 113 is disposed a predetermined distance away from and in the periphery of the transmission resonator 105 and the transmission wiring 104 on the top face of the transmission substrate 101. The coplanar ground 113 is a metal conductor. The material for the metal conductor is, for example, gold. The coplanar ground 113 is wiring that represents the reference potential of a high-frequency signal to be transmitted in the transmission substrate 101.

Note that the back face ground 112 and the coplanar ground 113 may be connected to each other through a via hole. This improves the efficiency of the electromagnetic resonance coupler 10 in transmitting a high-frequency signal.

In the transmission wiring 104, one end that is not connected to the transmission resonator 105 is an input terminal 110. For the purpose of connecting an upstream circuit to the input terminal 110, the reception substrate 102 is not disposed above the input terminal 110. That is, the reception substrate 102 is not formed above the input terminal 110. The input terminal 110 included in the transmission wiring 104 receives input of a high-frequency signal transmitted by the electromagnetic resonance coupler 10.

As illustrated in FIG. 4, reception wiring 107 (second input/output wiring) and a reception resonator 108 (second resonant wiring) are disposed on a top face of the reception substrate 102. One end of the reception wiring 107 is electrically connected to the reception resonator 108 on a second connection portion of the reception resonator 108. The second connection portion is provided at a position that is away from one end of the reception resonator 108 by a distance corresponding to one fourth the wiring length of the reception resonator 108. The reception wiring 107 and the reception resonator 108 are configured by metal wiring. The material for the metal wiring is, for example, gold.

The reception resonator 108 has a reception resonator slit 109 (opening). The shape of the reception resonator 108 will be described later.

As illustrated in FIG. 3, a coplanar ground 113 is disposed a predetermined distance away from and in the periphery of the reception resonator 108 and the reception wiring 107 on the top face of the reception substrate 102. The coplanar ground 113 is a metal conductor. The material for the metal conductor is, for example, gold.

In the reception wiring 107, one end that is not connected to the reception resonator 108 is an output terminal 111. For the purpose of connecting a downstream circuit to the output terminal 111, the cap substrate 103 is not disposed above the output terminal 111. That is, the cap substrate 103 is not formed above the output terminal 111. The output terminal 111 included in the reception wiring 107 outputs a signal that is input to the electromagnetic resonance coupler 10.

A cap ground 114 is formed on a top face of the cap substrate 103 so as to cover the top face. The cap ground 114 is a metal conductor. The material for the cap ground 114 is, for example, gold.

Note that the cap ground 114 is wiring that represents the reference potential of a high-frequency signal to be transmitted in the reception substrate 102.

The transmission resonator 105 and the reception resonator 108 has the same shape of wiring and the same size. The transmission resonator 105 and the reception resonator 108 face each other in a direction perpendicular to the transmission substrate 101 (the reception substrate 102 or the cap substrate 103). More specifically, when viewed in a direction perpendicular to a main face of the transmission substrate 101 (face of the transmission substrate 101 on which the transmission resonator 105 and the transmission wiring 104 are provided), the transmission substrate 101 and the reception substrate 102 are superimposed on each other so that the contours of the transmission resonator 105 and the reception resonator 108 match.

Here, the contour of the transmission resonator 105 is defined as follows. If it is assumed that the transmission resonator 105 has no transmission resonator slit 106 and is configured as closed wiring having a loop shape, the closed wiring of a loop shape has two contours: an inner (inside) contour that defines an area surrounded by the closed wiring of a loop shape; and an outer (outside) contour that defines the shape of the closed wiring of a loop shape together with the inner contour. Among these two contours, the contour of the transmission resonator 105 means the outer contour. In other words, the inner contour and the outer contour define the wiring width of the transmission resonator 105, and the outer contour defines the area occupied by the transmission resonator 105.

The transmission resonator 105 and the reception resonator 108 are disposed facing each other in the direction perpendicular to the main face of the transmission substrate 101 so that they are symmetric with respect to a point of intersection between the central axis of the shapes of wirings on the transmission resonator 105 and the reception resonator 108 and an intermediate plane between the transmission resonator 105 and the reception resonator 108.

The "intermediate plane" as used here refers to, among planes parallel to the transmission substrate 101, a plane that passes through an intermediate point (midpoint) of the distance between the transmission resonator 105 and the reception resonator 108 in the direction perpendicular to the main face of the transmission substrate 101. That is, when viewed in the direction perpendicular to the main face of the transmission substrate 101, the transmission substrate 101 and the reception substrate 102 are superimposed on each other so that their shapes are symmetric with respect to a point.

Figure 5:
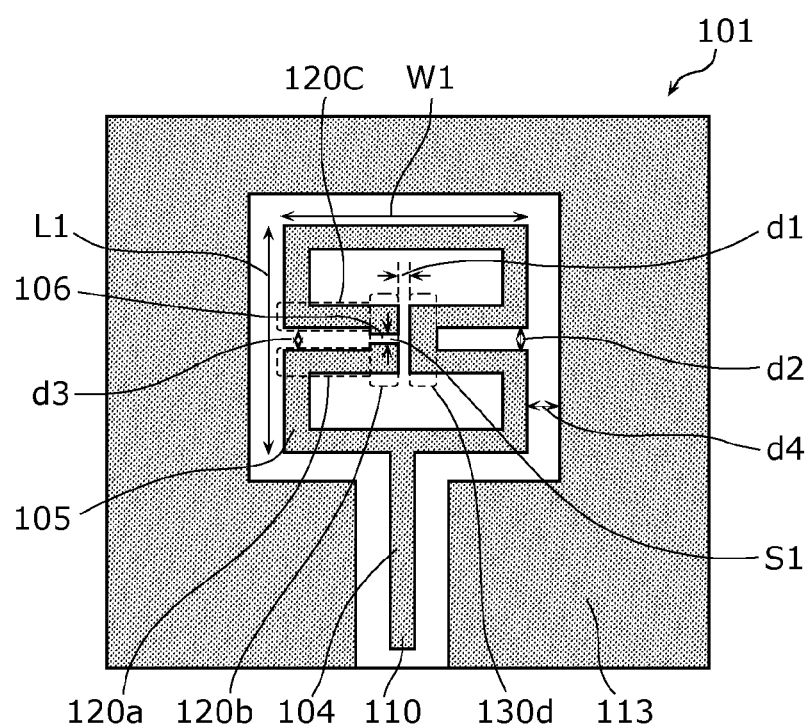
FIG. 5 is a top view of a transmission substrate according to Embodiment 1.

FIG. 5 illustrates the shape of the metal wiring that is formed on the top face of the transmission substrate 101 and includes the transmission wiring 104 and the transmission resonator 105. Hereinafter, the shape of the transmission resonator 105 will be described. Note that since the reception resonator 108 has the same shape and size as the transmission resonator 105 as mentioned above, a description thereof has been omitted.

The transmission resonator 105 has a shape obtained by opening (cutting) the loop-shaped wiring at one place to make the transmission resonator slit 106. That is, part of the transmission resonator 105 is opened by the transmission resonator slit 106.

The above loop shape is a shape that includes two recessed portions that are recessed inwardly of the loop shape. The term "inwardly" as used here means the center side (central side) of the loop shape when viewed in the direction perpendicular to the main face of the transmission substrate 101. In other words, if it is assumed that the transmission resonator 105 has no transmission resonator slit 106 and is configured as closed wiring having a loop shape, the term "inwardly" as used here refers to the side of an area enclosed by the closed wiring of the loop shape. In the transmission resonator 105, the transmission resonator slit 106 is provided in wiring that constitutes one of the recessed portions.

If there is no transmission resonator slit 106, the transmission resonator 105 of a loop shape has a line symmetrical shape with respect to a straight line that divides the transmission wiring 104 into two equal parts in the wiring direction. The transmission resonator 105 also has a line symmetrical shape with respect to a straight line that passes through the center of the transmission resonator slit 106 and is perpendicular to the above straight line. If there is no transmission resonator slit 106, the transmission resonator 105 of a loop shape has a point symmetrical shape with respect to the central point of the transmission resonator 105. That is, the shape of the transmission resonator 105 is a symmetrical shape. In other words, the two recessed portions are provided so as to be symmetric with respect to a straight line that divides the transmission wiring 104 into two equal parts in the wiring direction.

While the transmission resonator 105 in Embodiment 1 has a line symmetrical shape, it may achieve similar functionality even if not having line symmetry. Note that the loop shape refers to a closed shape in which one wiring intersects with neither another wiring nor part of its own wiring. One example is a ring shape. The details of the shape of the transmission resonator 105 will be described later.

As described above, the reception resonator 108 disposed facing the transmission resonator 105 has the same shape as the transmission resonator 105.

By in this way, disposing the two wirings, each having a loop shape opened by a slit, a predetermined distance away from each other, electromagnetic resonance coupling is established between the two wirings having a loop shape (transmission resonator 105 and reception resonator 108).

In order to establish strong electromagnetic resonance coupling between the transmission resonator 105 and the reception resonator 108, the distance between the transmission resonator 105 and the reception resonator 108 in the direction perpendicular to the main face of the transmission substrate 101 needs to be less than or equal to approximately the wavelength of a high-frequency signal transmitted by the electromagnetic resonance coupler 10.

In Embodiment 1, the transmission substrate 101 and the reception substrate 102 are superimposed on each other so that the distance between the transmission resonator 105 and the reception resonator 108 in the direction perpendicular to the main face of the transmission substrate 101 is less than or equal to one half the wavelength of a high-frequency signal to be transmitted. Specifically, the reception substrate 102 is formed to a thickness (length in the direction perpendicular to the main face of the reception substrate 102) that is less than or equal to one half the wavelength of a high-frequency signal to be transmitted.

Here, the wavelength of a high-frequency signal is a wavelength that takes into consideration a velocity factor of the material for the wirings in which the signal is transmitted, and a velocity factor of the dielectric that intervenes between the transmission resonator 105 and the reception resonator 108. In Embodiment 1, these velocity factors are determined by gold as the material for the wirings and sapphire as the base material.

The above has been a description of the structure of the electromagnetic resonance coupler 10 according to Embodiment 1.

Note that in the structure of FIG. 3, the transmission substrate 101 has a coplanar line structure in which the coplanar ground 113 is provided in the periphery of the transmission wiring 104. Specifically, as illustrated in FIG. 3, the coplanar ground 113 is provided at a position that is a distance d4 away from the outer contours of the transmission resonator 105 and the transmission wiring 104 (in the case of the transmission resonator 105, the contour excluding the recessed portions). Alternatively, the transmission substrate 101 may have a micro-strip line structure or a grounded coplanar line structure.

In the structure of FIG. 3, the reception substrate 102 may have a coplanar line structure in which a coplanar ground is provided in the periphery of the reception wiring 107. In this case, the coplanar ground formed in the periphery of the reception wiring 107 and the cap ground 114 may be electrically connected to each other through a via hole 140 as illustrated in FIG. 4. This improves the efficiency of the electromagnetic resonance coupler 10 in transmitting a high-frequency signal. Alternatively, the reception substrate 102 may have a grounded coplanar line structure.

(Shape of Resonators)

Now, the shapes of the resonators of the electromagnetic resonance coupler 10 according to Embodiment 1 will be described.

The electromagnetic resonance coupler 10 according to Embodiment 1 can reduce its operating frequency by changing the shapes of the transmission resonator 105 and the reception resonator 108.

In general, the self-resonant frequency of a resonator (LC resonator) is determined based on the self-inductance (L) and self-capacitance (C) of the resonator as follows (Formula 2). That is, the self-resonant frequency of the resonator decreases as the inductance component and the capacitance component increase.

$$fr = \frac{1}{2\pi\sqrt{LC}}$$ [Formula 2]

In the case of an open-ring electromagnetic resonance coupler, the self-inductances of the resonators are determined based on wirings, and the self-capacitances are determined based on cut slits formed in the wirings of the resonators.

Also, in the case of the open-ring electromagnetic resonance coupler, the inductance or capacitance components of the resonators can be increased by concentrating the electromagnetic field between the resonators that are superimposed on each other. Specifically, for example, the capacitance components of the resonators can be increased by intensifying the electromagnetic field at the slits.

In the electromagnetic resonance coupler 10 according to Embodiment 1, the capacitance component of the transmission resonator 105 is increased by densely packing the wirings in the periphery of the transmission resonator slit 106 and thereby intensifying the electromagnetic field in the periphery of the transmission resonator slit 106. This results in a reduction in the operating frequency of the electromagnetic resonance coupler 10.

In the electromagnetic resonance coupler 10 according to Embodiment 1, part of the wiring that forms the transmission resonator 105 is shaped to be close to the transmission resonator slit 106. That is, the capacitance component of the transmission resonator 105 is increased by densely packing the wiring in the periphery of the transmission resonator slit 106 and thereby intensifying the electromagnetic field in the periphery of the transmission resonator slit 106. This results in a reduction in the operating frequency of the electromagnetic resonance coupler 10.

The transmission resonator 105 illustrated in FIG. 5 is a closed circuit that is formed of a single metal wire and that has an cutaway portion (opening) in part. Hereinafter, this cutaway portion is referred to as the "transmission resonator slit 106". The closed circuit does not necessarily have to be formed of a single metal wire, and it means a circuit that is electrically connected. The "closed circuit" as used here carries similar meaning as forming a closed space (internal space 1053 in FIG. 6) when viewed from above the transmission substrate 101.

A densely packed wiring lateral distance d1 in FIG. 5 is a distance in the horizontal direction between the transmission resonator slit 106 and a portion that is close to the transmission resonator slit 106 in the transmission resonator 105, when viewed in the direction perpendicular to the main face of the transmission substrate 101 (when viewed from above). Here, the "horizontal direction" refers to a horizontal direction when viewed from above the transmission substrate 101 in a state in which the transmission resonator 105 is disposed above the transmission wiring 104 as illustrated in FIG. 5. That is, the horizontal direction is a direction perpendicular to the transmission wiring 104.

In FIG. 5, the two recessed portions of the transmission resonator 105 are respectively referred to as a first recessed portion (left-side recessed portion in FIG. 5) and a second recessed portion (right-side recessed portion in FIG. 5). The densely packed wiring lateral distance d1 specifically means a distance between wiring 120b where the transmission resonator slit 106 is provided, among wirings 120a, 120b, and 120c that constitute the first recessed portion, and wiring 130d among the wiring that constitutes the second recessed portion.

Here, the electromagnetic field of a high-frequency signal that propagates through wirings spreads and propagates in accordance with the wiring width. The degree of spread of the electromagnetic field is determined by the degree of confinement of the wirings, and it roughly spreads to approximately four times the wiring width. That is, if it is desired to intensity the electromagnetic field, it is preferable for the wirings to be close to each other in the range of approximately four times the wiring width. Accordingly, the densely packed wiring lateral distance d1 is a length that is in the range of four times the wiring width of the transmission resonator 105.

Also, in FIG. 5, distances in the vertical direction between metal wirings included in the transmission resonator 105, when viewed from above, are illustrated as "densely packed wiring longitudinal distances d2 and d3."

The densely packed wiring longitudinal distance d3 specifically means a distance between the wiring 12a and the wiring 12c among the wirings 120a, 120b, and 120c that constitute the first recessed portion. The densely packed wiring lateral distance d3 is a length that is in the range of four times the wiring width of the transmission resonator 105.

In summary, in the transmission resonator 105, at least some of the wirings 120a, 120b, and 120c that constitute the recessed portion are close to wiring other than the at least some of the wirings at a distance less than or equal to four times the wiring width. Also, in Embodiment 1, the densely packed wiring longitudinal distances d2 and d3 are equal because the transmission resonator 105 has a line symmetrical shape. Thus, a description of the densely packed wiring longitudinal distance d2 has been omitted.

In this way, densely packing the wirings and concentrating the electromagnetic field in the periphery of the transmission resonator slit 106 is equivalent to increasing the self-capacitance component of the transmission resonator 105. Also, bringing the wirings in the transmission resonator 105 close to each other and concentrating the electromagnetic field is equivalent to increasing the self-inductance component of the transmission resonator 105.

Accordingly, the operating frequency of the electromagnetic resonance coupler 10 can be reduced by providing the recessed portions on the transmission resonator 105.

In other words, the operating frequency is determined by the densely packed wiring lateral distance d1, the densely packed wiring longitudinal distances d2 and d3, and the width of the metal wiring constituting the transmission resonator 105.

Furthermore, providing the recessed portions on the inner side of the transmission resonator 105 (on the inner peripheral side of the loop shape) increases the wiring length of the transmission resonator 105 in the same area on the substrate. The operating frequency is also reduced by increasing the wiring length in this way.

Next, the shape of the transmission resonator 105 will be described focusing on two parts: the recessed portions and the other portion.

Figure 6:
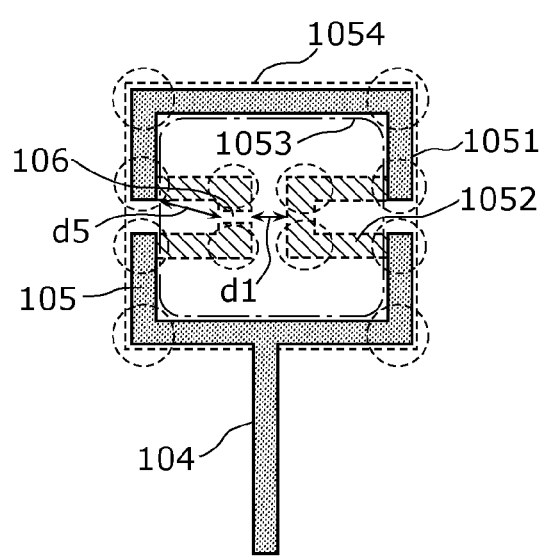
FIG. 6 is a top view of a transmission resonator according to Embodiment 1.

FIG. 6 illustrates the shape of the transmission resonator 105, viewed from above.

The transmission resonator 105 includes first wiring 1051 and second wiring 1052 that constitutes the recessed portions.

The wiring indicated by the solid line in FIG. 6 is the first wiring 1051 formed of linear wires. The first wiring 1051 is wiring that does not constitute the recessed portions. In other words, the first wiring 1051 is bracket-shaped wiring that defines the internal space 1053 of the transmission resonator 105.

The internal space 1053 is a square area enclosed by the single-dot broken line in FIG. 6. Note that the shape of the first wiring 1051 is not limited to that bracket shape. For example, the first wiring 1051 may have an angled bracket shape or a round bracket shape. In this case, the internal space 1053 has a shape of a polygon or a circle (ellipse).

Note that the contour of the transmission resonator 105 excluding the wiring that constitutes the recessed portions is rectangular. Here, the contour excluding the recessed portions means the outer contour of the transmission resonator 105 in the case where the transmission resonator 105 is configured without forming recessed portions, and it corresponds to a contour 1054 in FIG. 6.

The second wiring 1052 is wiring having a shape indicated by the dotted line in FIG. 6. The second wiring 1052 is wiring that constitutes the recessed portions formed in the internal space 1053 of the transmission resonator 105, and is formed of linear wires. That is, when viewed from above, the recessed portions of the transmission resonator 105 are recessed on the internal space 1053 side, i.e., on the inner side. The second wiring 1052 includes the transmission resonator slit 106.

The distance d1 between the transmission resonator slit 106 and the second wiring 1052 is shorter than a distance d5 between the transmission resonator slit 106 and the first wiring 1051. By forming the transmission resonator slit 106 and the second wiring 1052 in the internal space 1053 of the transmission resonator 105, the metal wiring included in the transmission resonator 105 can be formed in the vicinity of the transmission resonator slit 106.

That is, the transmission resonator 105 that includes the second wiring 1052 can concentrate the electromagnetic field in the periphery of the transmission resonator slit 106, more than in the case where the transmission resonator is formed of only the first wiring 1051 surrounding the internal space 1053. This results in a reduction in the electromagnetic resonant frequency (operating frequency) of the transmission resonator 105.

The transmission resonator slit 106 is provided in the vicinity of the center of an area (internal space 1053) that is surrounded by the wiring forming the transmission resonator 105. The transmission resonator 105 has a shape in which the other part of the wiring forming the transmission resonator 105 is brought close to two opposite wiring ends formed by cutting out the transmission resonator slit 106. Such a shape of wiring in which the capacitance component is increased by bringing the other part of the wiring close to the transmission resonator slit 106 and the inductance component is increased by bringing the wirings of the transmission resonator 105 close to each other is the feature of the transmission resonator 105.

Note that the transmission resonator 105 has a shape that includes 12 bent portions, each surround by a circular dotted line in FIG. 6. That is, the transmission resonator 105 has a shape that includes five or more bent portions. In the case where the transmission resonator 105 excluding the wiring constituting the recessed portions has a rectangular contour as illustrated in FIG. 6, the bent portions are right-angled bent portions on the transmission resonator 105.

Note that the second wiring 1052 (recessed portions) has a bracket shape in FIG. 6, it is not limited to this shape. For example, the second wiring 1052 may have an angled bracket shape or a round bracket shape.

Figure 7:
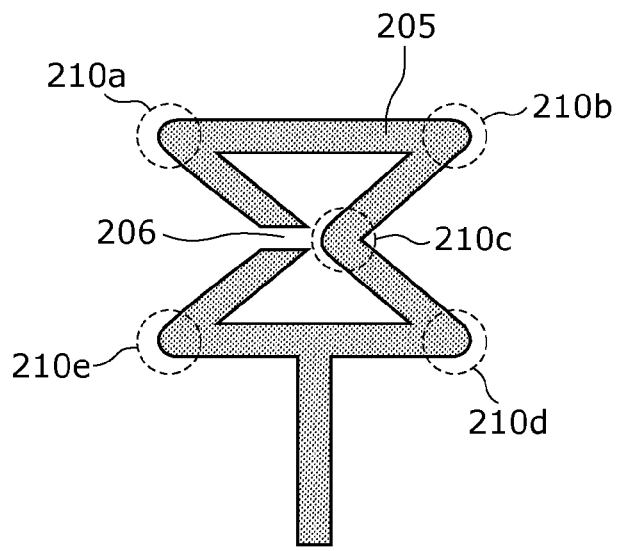
FIG. 7 is a top view illustrating a variation on the transmission resonator according to Embodiment 1.

FIG. 7 shows an example of a transmission resonator in which recessed portions have an angled bracket shape. A transmission resonator 205 as illustrated in FIG. 7 can also increase its self-capacitance component because a transmission resonator slit 206 is close to a bent portion 210c of the transmission resonator 205.

Note that the transmission resonator 205 illustrated in FIG. 7 has a shape that includes five bent portions 210a to 210e. That is, the bent portions do not always mean right-angled bent portions as illustrated in FIG. 6.

Hereinafter, a specific configuration (material and size) of the electromagnetic resonance coupler 10 will be described.

The materials for the transmission substrate 101, the reception substrate 102, and the cap substrate 103 are sapphire substrates having a thickness of 200 μm.

The transmission wiring 104, the transmission resonator 105, the reception wiring 107, and the reception resonator 108 have a wiring width of 100 μm and are made of gold. The transmission resonator 105 and the reception resonator 108 have dimensions of 1 mm by 1 mm (W1=L1=1 mm), viewed from above the electromagnetic resonance coupler 10 (in the direction perpendicular to the main face of the transmission substrate 101).

The transmission resonator slit 106 has a width (S1) of 40 μm. The "width" as used here refers to a width in a direction perpendicular to the wiring width and is denoted by S1 in FIG. 5.

The densely packed wiring lateral distance indicated by d1 in FIG. 5 is 40 μm, and the densely packed wiring longitudinal distance indicated by d2 is 0.1 mm.

The coplanar ground 113 is formed at a position that is 140 μm (corresponding to d4 in FIG. 5) away from the contours of the transmission resonator 105 and the transmission wiring 104 on the transmission substrate 101.

(Transmission Characteristic)

Next, a signal transmission characteristic of the electromagnetic resonance coupler 10 will be described.

A high-frequency signal that is input from the input terminal 110 passes through the transmission wiring 104 and reaches the transmission resonator 105.

In the case where the two resonators (transmission resonator 105 and reception resonator 108) having the same self-resonant frequency are spaced from each other by a distance that allows electromagnetic field coupling, the two resonators make electromagnetic resonance coupling that triggers resonance at the resonant frequency.

Thus, when a high-frequency signal at the resonant frequency is input to the transmission resonator 105, a high-frequency signal at the same resonant frequency will occur in the reception resonator 108. Note that the resonant frequency of the electromagnetic resonance coupler 10 has a certain degree of bandwidth, and the electromagnetic resonance coupler 10 can transmit high-frequency signals in this frequency band.

Thus, only high-frequency signals in the resonant frequency band are transmitted to the reception resonator 108, and high-frequency signals outside the resonant frequency band are not transmitted to the reception resonator 108.

A high-frequency signal transmitted to the reception resonator 108 is output to the output terminal 111 through the reception wiring 107 connected to the reception resonator 108. Because the transmission wiring 104 and the transmission resonator 105 are physically separated from the reception wiring 107 and the reception resonator 108, the high-frequency signal is transmitted without contact.

In the electromagnetic resonance coupler 10 with the above-described configuration according to Embodiment 1, the frequency of a high-frequency signals to be transmitted is 9.5 GHz. Now, the transmission characteristic in this frequency band will be described.

Figure 8:
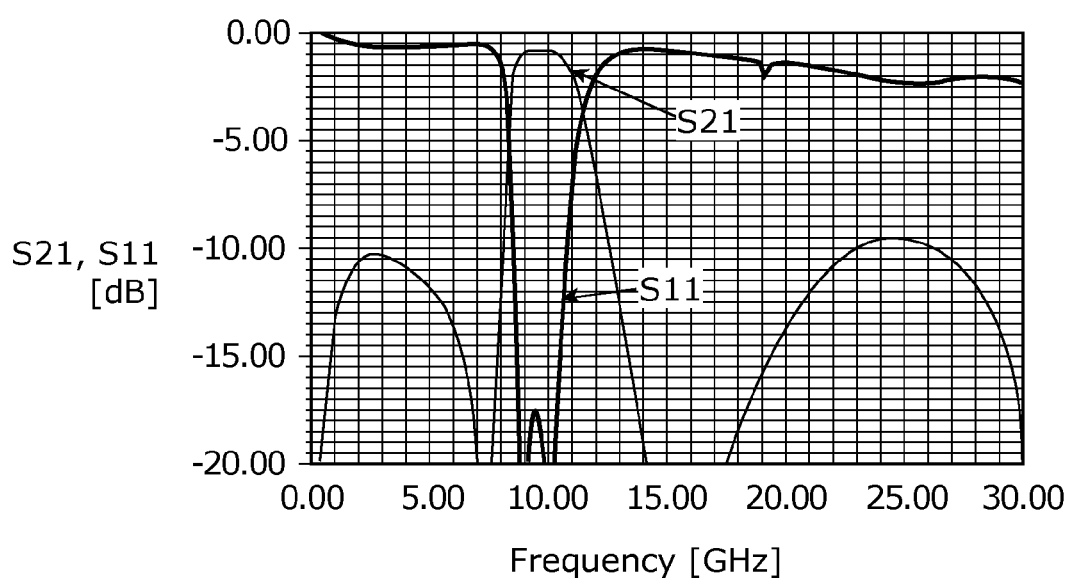
FIG. 8 shows a transmission characteristic of the electromagnetic resonance coupler according to Embodiment 1.

FIG. 8 shows the transmission characteristic of the electromagnetic resonance coupler 10 according to Embodiment 1.

A signal transmission rate S21 from the input terminal 110 to the output terminal 111, and signal reflectance S11 at the input terminal 110 are shown in FIG. 8.

The signal transmission rate S21 refers to the degree to which the signal that is input to the input terminal 110 is transmitted to the output terminal 111, and indicates that the transmission characteristic improves as the value on the vertical axis of the graph in FIG. 8 approaches 0 db.

The signal reflectance S11 refers to the degree to which the signal that is input to the input terminal 110 is reflected and appears at the input terminal 110, and indicates that the transmission characteristic improves as the value on the vertical axis in FIG. 8 decreases.

As can be seen from FIG. 8, the signal transmission rate S21 becomes greater than the signal reflectance S11 in the frequency band around 9.5 GHz. That is, the electromagnetic resonance coupler 10 can transmit high-frequency signals in the 9.5-GHz frequency band with the frequency of 9.5 GHz as the center from the input terminal 110 to output terminal 111. Specifically, high-frequency signals are transmitted in the 9.5-GHz frequency band with insertion losses of approximately 0.7 dB.

The operating frequency of the open-ring electromagnetic resonance coupler having a diameter of 1 mm in FIG. 1 is approximately 15 GHz. Accordingly, the operating frequency of the electromagnetic resonance coupler 10 according to Embodiment 1 is less than or equal to two-thirds that of the conventional electromagnetic resonance coupler. That is, if the electromagnetic resonance coupler 10 according to Embodiment 1 is designed to transmit high-frequency signals in the 15-GHz frequency band, the area occupied by the transmission resonator 105 has dimensions of 0.7 mm by 0.7 mm, which is approximately a half that of the conventional transmission resonator. Accordingly, the size of the apparatus (electromagnetic resonance coupler) can be considerably reduced.

(Variations)

The electromagnetic resonance coupler 10 using the transmission resonator 105 (reception resonator 108) that has two recessed portions was described in Embodiment 1. It is, however, noted that the operating frequency and size of the apparatus can be further reduced by providing three or more recessed portions on the resonators.

Figure 9:
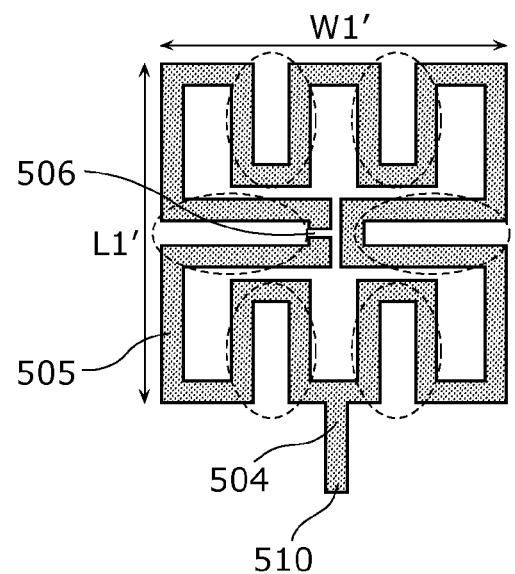
FIG. 9 is a top view illustrating another variation on the transmission resonator according to Embodiment 1.

FIG. 9 illustrates a variation on the transmission resonator.

A transmission resonator 505 includes six recessed portions that correspond to the second wiring 1052 formed in the internal space 1053 illustrated in FIG. 6. Portions surrounded by dotted lines in FIG. 9 correspond to the recessed portions.

Because more wirings are close to the periphery of a transmission resonator slit 506, the electromagnetic field in the periphery of the transmission resonator slit 506 is further intensified, and the capacitance component of the transmission resonator 505 is reduced more than that of the transmission resonator 105. In addition, the inductance component of the transmission resonator 505 is increased more than that of the transmission resonator 105 because more wirings of the transmission resonator 505 are close to each other. Accordingly, the electromagnetic resonance coupler using the transmission resonator 505 and a reception resonator each having a shape as illustrated in FIG. 9 can further reduce its operating frequency and size.

Note that the transmission resonator slit does not necessarily have to be provided in a recessed portion. Also, the contour of the transmission resonator excluding the wiring constituting the recessed portions does not necessarily have to the same aspect ratio. In other words, W1'=L1' does not necessarily have to be satisfied in FIGS. 5 and 9.

Note that a transmission wiring 504 and an input terminal 510 respectively have the same configurations and functions as the transmission wiring 104 and the input terminal 110 illustrated in FIG. 5.

Figure 10:
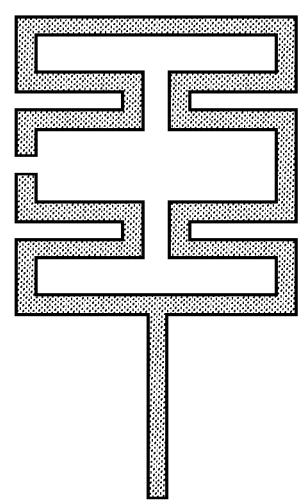
FIG. 10 illustrates yet another variation on the transmission resonator according to Embodiment 1.

FIG. 10 illustrates another variation on the transmission resonator.

Because more wirings are close to each other, the transmission resonator illustrated in FIG. 10 also has a greater inductance component than the transmission resonator 105. Accordingly, the electromagnetic resonance coupler using the transmission resonator and a reception resonator each having a shape as illustrated in FIG. 10 can also reduce its operating frequency and size.

The above has been a description of the electromagnetic resonance coupler 10 and variations thereon according to Embodiment 1.

The electromagnetic resonance coupler 10 according to Embodiment 1 can easily reduce its size and operating frequency by changing the wiring patterns of the transmission resonator and the reception resonator.

Note that the features of the electromagnetic resonance coupler are that highly efficient non-contact transmission is possible due to the use of electromagnetic resonance coupling, and that unwanted radiation is reduced due to the less likelihood of radio wave radiation. It is also possible to isolate (insulate) the grounds between the input and output terminals and transmit a high-frequency signal.

Embodiment 2

Hereinafter, Embodiment 2 of the present invention will be described.

Embodiment 2 differs from Embodiment 1 only in the shapes of the transmission resonator and the reception resonator. Thus, the details described in Embodiment 1 have been omitted.

A feature of an electromagnetic resonance coupler according to Embodiment 2 is that its transmission and reception resonators have a wound shape (spiral shape), unlike in Embodiment 1.

Figure 11:
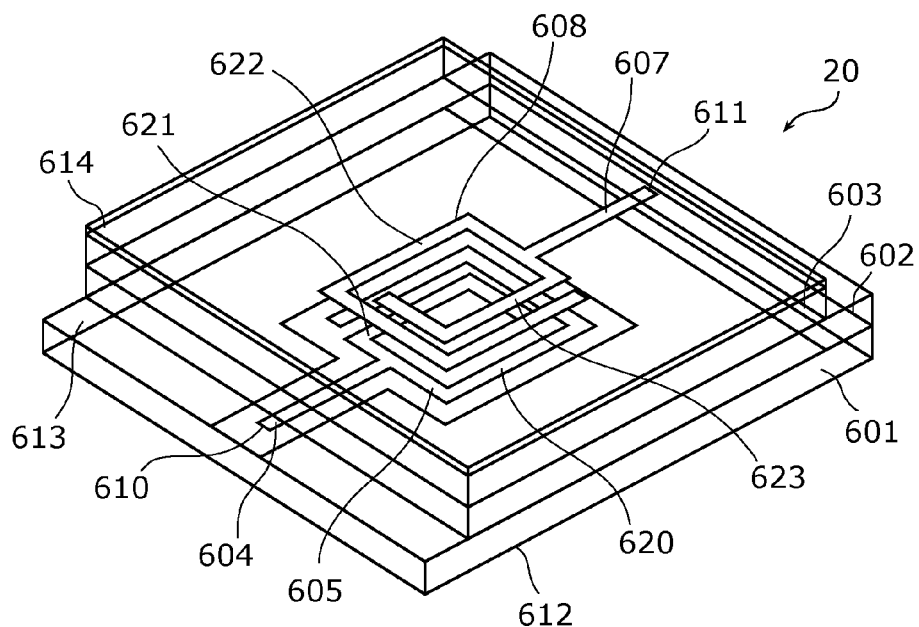
FIG. 11 is an oblique (perspective) view of an electromagnetic resonance coupler according to Embodiment 2.

FIG. 11 is an oblique (perspective) view of an electromagnetic resonance coupler 20 according to Embodiment 2.

A problem with an electromagnetic resonance coupler using spiral-shaped resonators as disclosed in Patent Literature 2 is its relatively low transmission characteristic.

On the other hand, the electromagnetic resonance coupler 20 according to Embodiment 2 having a configuration as will be described below and illustrated in FIG. 11 enables highly efficient signal transmission and can be reduced in size.

The electromagnetic resonance coupler 20 illustrated in FIG. 11 includes a transmission substrate 601 formed of a dielectric, a reception substrate 602 formed of a dielectric superimposed above the transmission substrate 601, and a cap substrate 603 formed of a dielectric superimposed above the reception substrate 602.

On a top face of the transmission substrate 601, transmission wiring 604, a transmission resonator 605, and a coplanar ground 613 are formed of metal wiring made of gold. The coplanar ground 613 is provided by a predetermined distance away from the transmission wiring 604 and the transmission resonator 605 so as to surround the transmission wiring 604 and the transmission resonator 605.

On a top face of the reception substrate 602, reception wiring 607 and a reception resonator 608 are formed of metal wiring made of gold.

On a top face of the cap substrate 603, a cap ground 614 is formed of metal wiring made of gold. The transmission resonator 605 and the reception resonator 608 have the same shape and size. The transmission resonator 605 and the reception resonator 608 are disposed facing each other in a direction perpendicular to a main face of the transmission substrate 601 so that they are symmetric with respect to a point of intersection between a central axis of the shapes of wirings of the transmission resonator 605 and the reception resonator 608 and an intermediate plane between the transmission resonator 605 and the reception resonator 608. That is, when viewed in the direction perpendicular to the main face of the transmission substrate 601, the transmission substrate 601 and the reception substrate 602 are superimposed on each other so that the shapes of the transmission resonator 605 and the reception resonator 608 are symmetric with respect to a point. Also, when viewed in the direction perpendicular to the main face of the transmission substrate 601, the transmission substrate 601 and the reception substrate 602 are superimposed on each other so that the contours of the transmission resonator 605 and the reception resonator 608 match.

Note that in Embodiment 2, the contour of the transmission resonator 605 indicates a shape defined by the outer contour of wiring that is routed along the outermost periphery of the transmission resonator 605.

Figure 12:
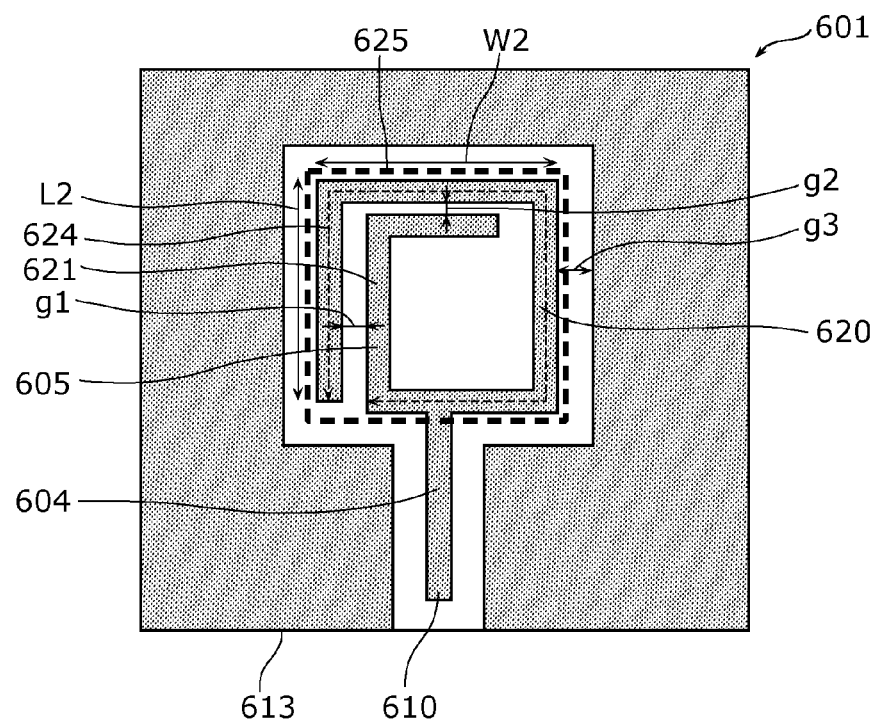
FIG. 12 is a top view of a transmission substrate according to Embodiment 2.

FIG. 12 illustrates a wiring pattern of the transmission substrate 601 according to Embodiment 2.

Hereinafter, the reception resonator 608 is assumed to have the same size and shape as the transmission resonator 605, and therefore a description thereof has been omitted.

As illustrated in FIG. 12, in the electromagnetic resonance coupler 20 of Embodiment 2, the transmission wiring 604 is connected to a first connection portion on the transmission resonator 605. The transmission resonator 605 is configured by transmission resonator inner wiring 621 and transmission resonator outer wiring 620, both branching off from the transmission wiring 604. Here, the transmission resonator inner wiring 621 is wiring that extends from an inner end of the transmission resonator 605 to the first connection portion. The transmission resonator outer wiring 620 is wiring that extends from the outer end of the transmission resonator 605 to the first connection portion. Note that a contour 625 of the transmission resonator 605 is square (rectangular) as indicated by the dotted line in FIG. 12. Here, the transmission resonator inner wiring 621 has a shape of the angled letter "U" (bracket shape).

Note that the transmission resonator outer wiring 620 has a shape that includes three bent portions, and the transmission resonator inner wiring 621 has a shape that includes two bent portions. That is, the transmission resonator 605 has a shape that includes five or more bent portions. The bent portions in this case refer to right-angled portions on the transmission resonator 605.

As in Embodiment 1, the transmission resonator 605 and the reception resonator 608 make electromagnetic resonance coupling, and a high-frequency signal that is input to the transmission resonator 605 is transmitted to the reception resonator 608. The frequency of this high-frequency signal is called an "operating frequency" or "resonant frequency." A wiring end of the transmission wiring 604 that is not connected to the transmission resonator 605 forms an input terminal 610 of the electromagnetic resonance coupler 20, and a wiring end of the reception wiring 607 that is not connected to the reception resonator 608 forms an output terminal 611 of the electromagnetic resonance coupler 20. That is, a high-frequency signal that is input from the input terminal 610 is output from the output terminal 611.

A feature of the electromagnetic resonance coupler 20 of the Embodiment 2 is that in the transmission resonator 605, the wiring length of the transmission resonator outer wiring 620 is longer than that of the transmission resonator inner wiring 621. Another feature is that the wiring length of the transmission resonator outer wiring 620 is longer than one half a wiring length 624 (length indicated by the dotted line arrow in FIG. 12) of wiring that is routed along the outermost periphery of the transmission resonator 605.

Figure 13:
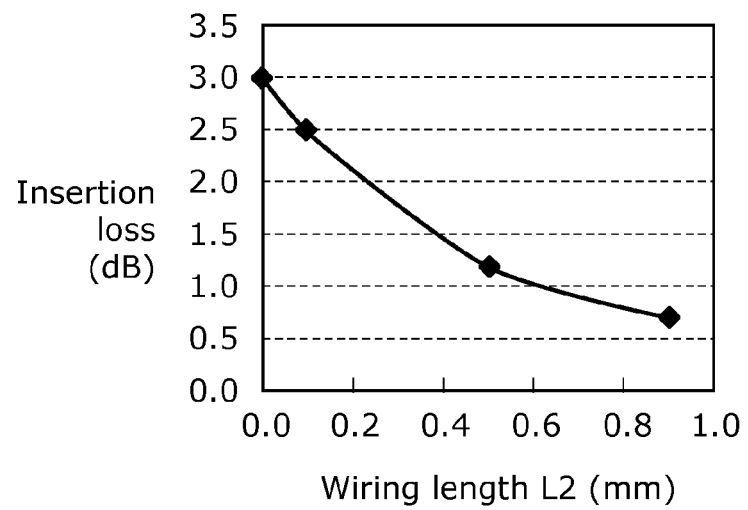
FIG. 13 shows a transmission characteristic of the electromagnetic resonance coupler according to Embodiment 2.

FIG. 13 shows an insertion loss with the electromagnetic resonance coupler 20 according to Embodiment 2, when the wiring length corresponding to L2 in FIG. 12 has been changed. Here, the insertion loss refers to an insertion loss at a frequency that gives the minimum loss.

As illustrated in FIG. 13, the insertion loss with the electromagnetic resonance coupler 20 decreases as the wiring length corresponding to L2 in FIG. 12 increases in the transmission resonator 605. In the spiral-shaped resonator as disclosed in Patent Literature 2, it is conceivable that the insertion loss is considerably large and thus efficient signal transmission is difficult due to the short transmission resonator outer wiring 620 relative to the transmission resonator inner wiring 621.

The electromagnetic resonance coupler 20 can reduce its operating frequency and enables highly efficient signal transmission by increasing the wiring length of the transmission resonator outer wiring 620.

(Characteristic)

Next is a description of the signal transmission characteristic of the electromagnetic resonance coupler 20 according to Embodiment 2 illustrated in FIG. 11.

First, a specific structure (size) of the electromagnetic resonance coupler 20 will be described with reference to FIG. 12.

The transmission substrate 601, the reception substrate 602, and the cap substrate 603 are sapphire substrates having a thickness of 200 μm.

The transmission wiring 604, the transmission resonator 605, the reception wiring 607, and the reception resonator 608 have a wiring width of 100 μm, and the transmission resonator 605 and the reception resonator 608 are each disposed in a square area having dimensions of 1 mm by 1 mm (W2=L2=1 mm).

A densely packed wiring lateral distance g1 is 100 μm, and a densely packed wiring longitudinal distance g2 is 50 μm. The coplanar ground 613 is disposed 140 μm (corresponding to g3 in FIG. 12) away from the transmission resonator 605 and the transmission wiring 604.

Figure 14:
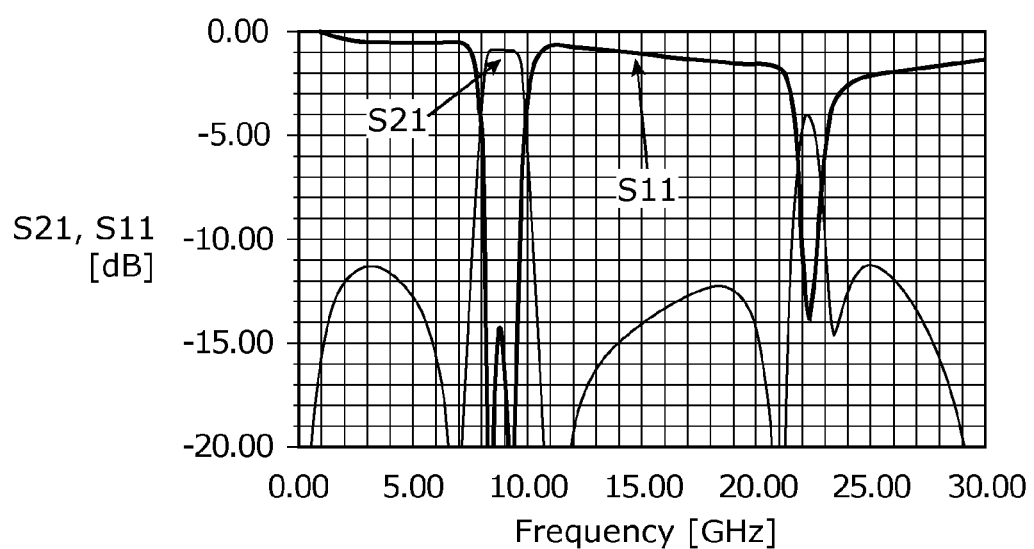
FIG. 14 shows a signal transmission characteristic of the electromagnetic resonance coupler according to Embodiment 2 when the length of the outermost wiring has been changed.

FIG. 14 shows the transmission characteristic of the electromagnetic resonance coupler 20.

Here, S21 denotes a signal transmission rate at which a signal is transmitted from the input terminal 610 to the output terminal 611, and S11 denotes signal reflectance at the input terminal 610.

As can be seen from FIG. 14, the electromagnetic resonance coupler 20 can highly efficiently transmit high-frequency signals in the 9.0-GHz frequency band with 9.0 GHz as the center from the input terminal 610 to the output terminal 611. Specifically, the insertion loss in the 9.0-GHz frequency band is on the order of 0.7 dB. In the case of a conventional open-ring electromagnetic resonance coupler that occupies substantially the same space and has a diameter of 1 mm in FIG. 1, the operating frequency is in the 15-GHz frequency band. That is, the operating frequency of the electromagnetic resonance coupler 20 of Embodiment 2 is less than or equal to two-thirds that of the conventional electromagnetic resonance coupler that occupies substantially the same space. Thus, if the electromagnetic resonance coupler of Embodiment 2 is designed to transmit high-frequency signals in the 15-GHz frequency band, the area occupied by the transmission resonator 105 has dimensions of 0.7 mm by 0.7 mm, which is approximately one half that occupied by the conventional transmission resonator. Accordingly, it is possible to considerably reduce the size of the apparatus (electromagnetic resonance coupler).

Furthermore, as described in Embodiment 1, the operating frequency can be further reduced by bringing wirings in the transmission resonator 605 close to each other and thereby increasing the inductance component of the transmission resonator 505. Specifically, the densely packed wiring lateral distance g1 and the densely packed wiring longitudinal distance g2 are set to be less than or equal to four times the wiring width of the transmission resonator 605. That is, the transmission resonator inner wiring may include a portion that is close to the transmission resonator outer wiring at a distance that is less than or equal to four times a predetermined wiring width.

Note that the shape of the transmission resonator according to Embodiment 2 is not limited to the shape illustrated in FIGS. 11 and 12.

Figure 15:
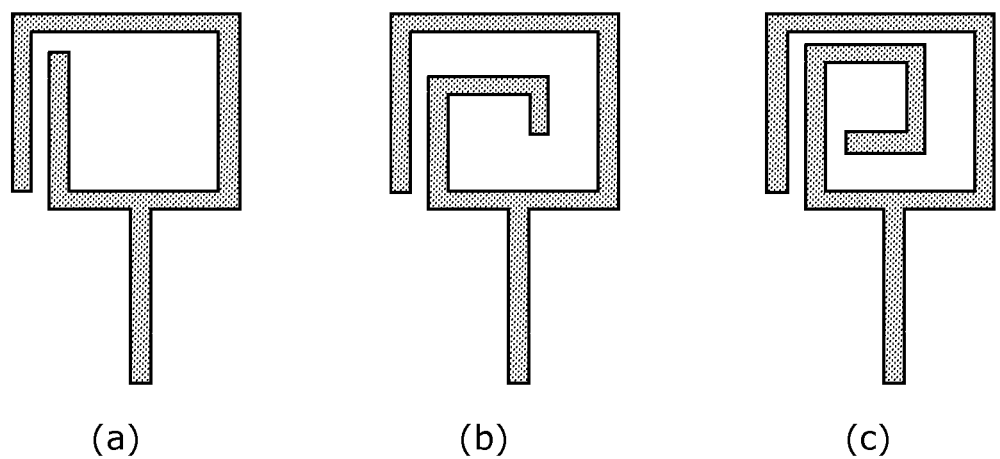
FIG. 15 is a top view illustrating a variation on the transmission resonator according to Embodiment 2.

In FIGS. 11 and 12, the transmission resonator inner wiring and the reception resonator inner wiring have a bracket shape. Alternatively, the shapes of the transmission resonator inner wiring and the reception resonator inner wiring may, for example, be a square or spiral shape as illustrated in FIGS. 15A, 15B, and 15C.

Figure 16:
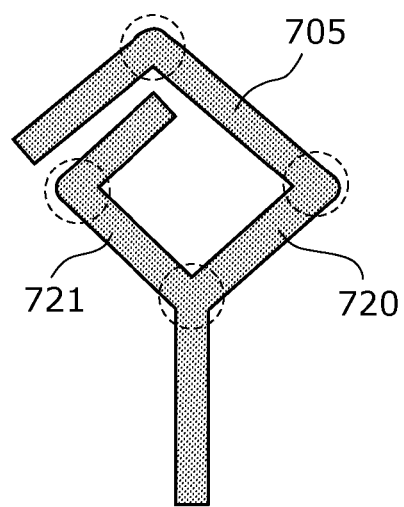
FIG. 16 is a top view illustrating another variation on the transmission resonator according to Embodiment 2.

Moreover, as in a transmission resonator 705 illustrated in FIG. 16, the transmission wiring may be connected to a bent portion on the transmission resonator. That is, the first connection portion on the transmission resonator may be provided in a bent portion. In the transmission resonator 705, transmission resonator outer wiring 720 includes two bent portions, and transmission resonator inner wiring 721 includes one bent portion. In this case as well, in the transmission resonator 705, the wiring length of the transmission resonator outer wiring 720 is longer than that of the transmission resonator inner wiring 721. Also, the wiring length of the transmission resonator outer wiring 720 is longer than one half the wiring length of wiring that is routed along the outermost periphery of the transmission resonator 705.

The above has been a description of the electromagnetic resonance coupler 20 and variations thereon according to Embodiment 2.

Like the electromagnetic resonance coupler 10 according to Embodiment 1, the electromagnetic resonance coupler 20 according to Embodiment 2 can easily reduce its size and operating frequency by changing the wiring patterns of the transmission resonator and the reception resonator.

(Supplement)

Hereinafter, supplementary descriptions are given regarding Embodiments 1 and 2.

While the first wiring 1051 and the second wiring 1052 illustrated in FIGS. 5 and 6 are configured as a combination of linear wires, part or the entire of the wirings may be configured by curved wires.

The coplanar ground provided to surround the transmission wiring 104 (transmission wiring 604) and the transmission resonator 105 (transmission resonator 605) illustrated in FIGS. 3 and 11 does not necessarily have to be provided.

Meanwhile, a coplanar ground may be provided in the periphery of the reception wiring 107 (reception wiring 607) and the reception resonator 108 (reception resonator 608) illustrated in FIGS. 3 and 11. In this case, the coplanar ground is wiring that represents a reference potential of a high-frequency signal to be transmitted in the reception substrate 102 (reception substrate 602).

At this time, the coplanar ground in the periphery of the reception wiring 107 (reception wiring 607) and the cap ground 114 (cap ground 614) may be electrically connected to each other through the via hole 140 as illustrated in FIG. 4. This improves the efficiency of the electromagnetic resonance coupler 10 (electromagnetic resonance coupler 20) in transmitting high-frequency signals.

The transmission resonator outer wiring 620, the transmission resonator inner wiring 621, the reception resonator outer wiring 622, and the reception resonator inner wiring 623 in FIG. 11 may be configured by serpentine wiring. Alternatively, part or the entire of the transmission resonator outer wiring 620, the transmission resonator inner wiring 621, the reception resonator outer wiring 622, and the reception resonator inner wiring 623 may be configured as curved wiring.

The contour 625 of the transmission resonator 605 in FIG. 11 may be of a circular shape, an ellipsoidal shape, or a polygonal shape. The same applies to the contour of the reception resonator 608.

The transmission resonator 105 (transmission resonator 605) and the reception resonator 108 (reception resonator 608) does not necessarily have to be directly superimposed on each other. That is, space or a fluid such as a resin may be provided between the transmission resonator 105 (transmission resonator 605) and the reception resonator 108 (reception resonator 608).

While the configuration in which the reception resonator 108 (reception resonator 608) is formed on reception substrate 102 (reception substrate 602) has been described, the reception resonator may be formed on the back face (face on which the gap ground is not formed) of the cap substrate 103 (cap substrate 603). Alternatively, a configuration is possible in which the reception resonator 108 (reception resonator 608) is formed on the back face of the reception substrate 102 (reception substrate 602), and the transmission substrate 101 (transmission substrate 601) and the reception substrate 102 (reception substrate 602) are superimposed on each other with space or via a dielectric.

Note that in the electromagnetic resonance coupler 10, the transmission resonator 105 and the reception resonator 108 may be provided on opposite sides of a single substrate. Specifically, a configuration is possible in which the transmission resonator 105 and the transmission wiring 104 are provided on one side of a substrate, and the reception resonator 108 and the reception wiring 107 are provided on the other side of the substrate. Similarly, in the electromagnetic resonance coupler 20, the transmission resonator 605 and the reception resonator 608 may be provided on opposite sides of a single substrate.

The cap ground 114 (cap ground 614) or the back face ground 112 (back face ground 612) does not necessarily have to be provided.

The order in which the transmission substrate, the reception substrate, and the cap substrate are superimposed is not limited to the orders illustrated in FIGS. 3 and 11.

It should be noted that the subject matter disclosed herein is not limited to the exemplary embodiments and the variations thereon described above. Embodiments that are obtained by making various kinds of modifications that would have been conceived by those skilled in the art to the exemplary embodiments or the variations thereon, or embodiments that are constructed by combining constituent elements of different exemplary embodiments or variations thereon are intended to be embraced in the subject matter disclosed herein within a range that does not deviate from the gist thereof.

The herein disclosed subject matter is to be considered descriptive and illustrative only, and the appended Claims are of a scope intended to cover and encompass not only the particular embodiments disclosed, but also equivalent structures, methods, and/or uses.

INDUSTRIAL APPLICABILITY

The electromagnetic resonance coupler according to one or more exemplary embodiments disclosed herein can be easily reduced in size and is applicable as, for example, a small non-contact power transmission apparatus, an electric signal insulating element, or an insulation semiconductor driving element.

The invention claimed is:

1. An electromagnetic resonance coupler for transmitting a signal between first resonant wiring and second resonant wiring without contact, the electromagnetic resonance coupler comprising:
a first substrate; and
a second substrate facing the first substrate,
wherein the first resonant wiring and first input/output wiring are provided on the first substrate, the first resonant wiring having a loop shape that includes an inwardly recessed portion and an opening, and the first input/output wiring being connected to a first connection portion in the first resonant wiring,
the second resonant wiring and second input/output wiring are provided on the second substrate, the second resonant wiring having the same wiring width and the same shape as the first resonant wiring, and the second input/output wiring being connected to a second connection portion in the second resonant wiring,
when viewed in a direction perpendicular to a main face of the first substrate, the first resonant wiring and the second resonant wiring are symmetric with respect to a point, and contours of the first resonant wiring and the second resonant wiring match,
a distance between the first resonant wiring and the second resonant wiring in a direction perpendicular to the main face of the first substrate is less than or equal to one half a wavelength of the signal, and
in the first resonant wiring, at least part of wiring that constitutes the recessed portion is close to wiring other than the at least part of wiring that constitutes the recessed portion at a distance that is less than or equal to four times the wiring width of the first resonant wiring.

2. The electromagnetic resonance coupler according to claim 1,
wherein the opening is provided in at least part of wiring that constitutes the recessed portion.

3. The electromagnetic resonance coupler according to claim 1,
wherein the first resonant wiring has a shape that includes five or more bent portions.

4. The electromagnetic resonance coupler according to claim 1,
wherein a contour of the first resonant wiring, excluding wiring that constitutes the recessed portion, is rectangular.

5. The electromagnetic resonance coupler according to claim 1,
wherein the first resonant wiring has a symmetrical shape.

6. The electromagnetic resonance coupler according to claim 1,
wherein ground wiring that represents a reference potential of the signal is provided on a face of the first substrate on which the first resonant wiring is not provided or a face of the second substrate on which the second resonant wiring is not provided.

7. The electromagnetic resonance coupler according to claim 1, further comprising
a cap substrate facing the second substrate,
wherein ground wiring that represents a reference potential of the signal is provided on a face of the cap substrate opposite the second substrate.

8. The electromagnetic resonance coupler according to claim 1,
wherein ground wiring that represents a reference potential of the signal is provided in a periphery of the first resonant wiring and the first input/output wiring on the first substrate or in a periphery of the second resonant wiring and the second input/output wiring on the second substrate.

9. The electromagnetic resonance coupler according to claim 1, further comprising
a cap substrate facing the second substrate,
wherein first ground wiring that represents a reference potential of the signal is provided on a face of the cap substrate opposite the second substrate,
second ground wiring that represents the reference potential of the signal is provided in a periphery of the second resonant wiring and the second input/output wiring on the second substrate, and
the first ground wiring and the second ground wiring are connected to each other through a via hole.

10. The electromagnetic resonance coupler according to claim 1,
wherein the first connection portion is provided at a position that is away from one end of the first resonant wiring by a distance corresponding to one fourth a wiring length of the first resonant wiring, and
the second connection portion is provided at a position that is away from one end of the second resonant wiring by a distance corresponding to one fourth a wiring length of the second resonant wiring.

11. An electromagnetic resonance coupler for transmitting a signal between first resonant wiring and second resonant wiring without contact, the electromagnetic resonance coupler comprising:
a first substrate; and
a second substrate facing the first substrate,
wherein the first resonant wiring and first input/output wiring are provided on the first substrate, the first resonant wiring having a loop shape of a predetermined wiring width, and the first input/output wiring being connected to a first connection portion in the first resonant wiring,
the second resonant wiring and second input/output wiring are provided on the second substrate, the second resonant wiring having the same wiring width and the same shape as the first resonant wiring, and the second input/output wiring being connected to a second connection portion in the second resonant wiring,
when viewed in a direction perpendicular to a main face of the first substrate, the first resonant wiring and the second resonant wiring are symmetric with respect to a point, and contours of the first resonant wiring and the second resonant wiring match,
a distance between the first resonant wiring and the second resonant wiring in the direction perpendicular to the main face of the first substrate is less than or equal to one half a wavelength of the signal, and
a wiring length from an outer end of the first resonant wiring to the first connection portion is longer than a wiring length from an inner end of the first resonant wiring to the first connection portion and is less than or equal to one half a wiring length of wiring that is routed along an outermost periphery of the first resonant wiring.

12. The electromagnetic resonance coupler according to claim 11,
wherein the first resonant wiring has a shape that includes two or more bent portions in wiring that extends from the inner end of the first resonant wiring to the first connection portion, and two or more bent portions in wiring that extends from the outer end of the first resonant wiring to the first connection portion.

13. The electromagnetic resonance coupler according to claim 11,
wherein wiring that extends from the inner end of the first resonant wiring to the first connection portion includes a portion that is close to wiring that extends from the outer end of the first resonant wiring to the first connection portion at a distance that is less than or equal to four times the predetermined wiring width.

14. The electromagnetic resonance coupler according to claim 11,
wherein a contour of the first resonant wiring is rectangular.

15. The electromagnetic resonance coupler according to claim 11,
wherein the first resonant wiring has a symmetrical shape.

16. The electromagnetic resonance coupler according to claim 11,
wherein ground wiring that represents a reference potential of the signal is provided on a face of the first substrate on which the first resonant wiring is not provided or a face of the second substrate on which the second resonant wiring is not provided.

17. The electromagnetic resonance coupler according to claim 11, further comprising
a cap substrate superimposed above the second substrate,
wherein ground wiring that represents a reference potential of the signal is provided on a face of the cap substrate opposite the second substrate.

18. The electromagnetic resonance coupler according to claim 11,
wherein ground wiring that represents a reference potential of the signal is provided in a periphery of the first resonant wiring and the first input/output wiring on the first substrate or in a periphery of the second resonant wiring and the second input/output wiring on the second substrate.

19. The electromagnetic resonance coupler according to claim 11, further comprising
a cap substrate superimposed above the second substrate,
wherein first ground wiring that represents a reference potential of the signal is provided on a face of the cap substrate opposite the second substrate,
second ground wiring that represents the reference potential of the signal is provided in a periphery of the second resonant wiring and the second input/output wiring on the second substrate, and
the first ground wiring and the second ground wiring are connected to each other through a via hole.

* * * * *